United States Patent [19]
Jeddeloh

[11] Patent Number: 6,035,432
[45] Date of Patent: Mar. 7, 2000

[54] SYSTEM FOR REMAPPING DEFECTIVE MEMORY BIT SETS

[75] Inventor: Joseph Jeddeloh, Minneapolis, Minn.

[73] Assignee: Micron Electronics, Inc., Nampa, Id.

[21] Appl. No.: 08/903,819

[22] Filed: Jul. 31, 1997

[51] Int. Cl.[7] ............................................. G11C 29/00
[52] U.S. Cl. ................................. 714/763; 714/710
[58] Field of Search ............................. 371/21.6, 40.11, 371/10.2; 395/182.05; 714/4, 763, 7, 8

[56] References Cited

U.S. PATENT DOCUMENTS

| | | | |
|---|---|---|---|
| 4,479,214 | 10/1984 | Ryan | 714/702 |
| 5,233,614 | 8/1993 | Singh | 714/723 |
| 5,379,415 | 1/1995 | Papenberg et al. | 714/5 |
| 5,410,545 | 4/1995 | Porter et al. | 371/21.6 |
| 5,535,328 | 7/1996 | Harari et al. | 395/182.05 |
| 5,546,402 | 8/1996 | Nijima et al. | 714/763 |
| 5,553,231 | 9/1996 | Papenberg et al. | 714/5 |
| 5,602,987 | 2/1997 | Harari et al. | 714/8 |
| 5,754,753 | 5/1998 | Smelser | 395/182.06 |
| 5,758,056 | 5/1998 | Barr | 395/182.05 |
| 5,862,314 | 1/1999 | Jeddeloh | 395/182.06 |

OTHER PUBLICATIONS

MindShare, Inc., Anderson and Shanley, "Pentium ™ Processor System Architecture," Second Edition, *PC System Architecture Series*: 126–132, 221–234, 1995.

*Primary Examiner*—Albert De Cady
*Assistant Examiner*—Shelly A Chase
*Attorney, Agent, or Firm*—Dorsey & Whitney LLP

[57] ABSTRACT

A computer system includes a memory controller that interfaces a memory requester with a memory device that may include defective memory cells. For each of plural memory blocks, defective bit sets having one or more defective memory cells are identified. A bit set error map is created and stored which identifies the defective bit sets of each of the memory blocks. In response to receiving from the memory requester a request for access to a requested storage location of the memory device, a determination is made from the error map whether the storage location is in a memory block that includes one or more defective bit sets. If the error map indicates that the requested storage location is in a memory block with one or more defective bit sets, then a determination is made from the error map which of the bit sets are defective. To execute the memory access request, the memory controller accesses the non-defective bit sets to which the detective bit sets have been mapped.

23 Claims, 4 Drawing Sheets

SYSTEM FOR REMAPPING DEFECTIVE MEMORY BIT SETS

TECHNICAL FIELD

The present invention relates to computer memory, and more particularly, to allowing computer memory having defective storage locations to be used in high accuracy applications.

BACKGROUND OF THE INVENTION

Substantially all modern electronic computers rely on semiconductor memory to store data and instructions for processing by a central processing unit (CPU). Such computers employing semiconductor memory vary from simple computers, such as those contained in telephone answering machines, to highly complex supercomputers employed for complicated scientific projects. In simple computers like those used for telephone answering machines, defects in one or more of the storage locations of the memory may be acceptable. For example, a mistake in the memory of the telephone answering machine likely would only cause the synthesized voice stored on the memory to be imperceptibly altered. However, one or more defective storage locations in a memory of a computer used to perform scientific calculations may cause substantial problems.

Although current manufacturing techniques have substantially reduced the number of defective storage locations, computer memory still is susceptible to such defective storage locations. Those defective memory locations can be caused by any of numerous steps taken during manufacture of the memory chips, semiconductor crystalinity defects, electrical connector discontinuities, etc. Although memory chips with such defective storage locations typically represent a small portion (less than 1%) of the total number of memory chips produced, the actual number of such defective memory chips is substantial. In some cases, such defective memory chips could be sold at a greatly reduced price for applications that do not require perfect memory, such as for telephone answering machines. However, it would be beneficial if some of those memory chips could be employed in more critical applications, such as in personal computers.

One way to enable such defective memory chips to be incorporated into personal computers would be to employ error correction schemes to compensate for defective storage locations. Error correction schemes add to each data word plural error correction bits that enable the data word to be reconstituted in the event of an erroneous data bit within the data word. However, such prior art error correction schemes typically only reconstitute a data word if only a single bit of the data word is erroneous. Such error correction schemes could be extended to detect multiple erroneous data bits, but the memory overhead that would result likely would be unacceptable.

SUMMARY OF THE INVENTION

An embodiment of the present invention is directed to a computer apparatus for interfacing a memory requester with a memory module that includes defective memory portions. The apparatus creates and stores a bit set error map that identifies the defective bit sets of a defective memory portion of the memory module. Using, the bit set error map, the apparatus maps the defective bit sets to non-defective replacement bit sets. In response to receiving a request to access the defective memory block, the apparatus accesses the replacement bit sets to which the defective bit sets are mapped. The bit set error map may be created and stored in a non-volatile memory section of the memory module and then stored in a memory module of a memory controller each time power is applied to the system.

In response to receiving from the memory requester a request for access to the defective memory block of the memory module, the apparatus determines from the bit set error map which bit sets are defective. If the access request is a request to write a word, then bits of the word corresponding to the defective bit sets are stored in the non-defective replacement locations to which the defective bit sets were mapped. If the access request is a request to read a word, then the replacement bits in the replacement bit sets are read and combined with the word bits not remapped to produce the word being requested. If the access request is a request to write a word to a selected storage location, then the bits corresponding to the defective bit sets are stored in the replacement bit sets and the bits corresponding to non-defective bit sets are stored normally. In providing the ability to access word bits from non-defective memory locations when a defective memory block is requested, the embodiment of the invention enables memory modules with plural defective bit sets in a defective memory block to be employed in error-sensitive computer applications.

In another aspect of the invention, error handling is performed on a block-by-block basis depending on the number of defective bit sets in each block. For each of a plurality of memory blocks, the apparatus determines whether the memory block includes more than a first threshold number of defective bit sets. If the memory block includes more than the first threshold number of defective bit sets, then requests for access to the memory block are processed according to a first error handling scheme. If the memory block does not include more than the first threshold number of defective bit sets, then processing requests for access to the memory block according to a second error handling scheme. For example, in one embodiment, if the memory block includes plural defective bit sets, then a bit remapping scheme can be employed as the first error handling scheme. If the memory block does not include plural defective bit sets, then error correcting codes can be employed in the second error handling scheme.

DETAILED DESCRIPTION OF THE INVENTION

Figure 1:
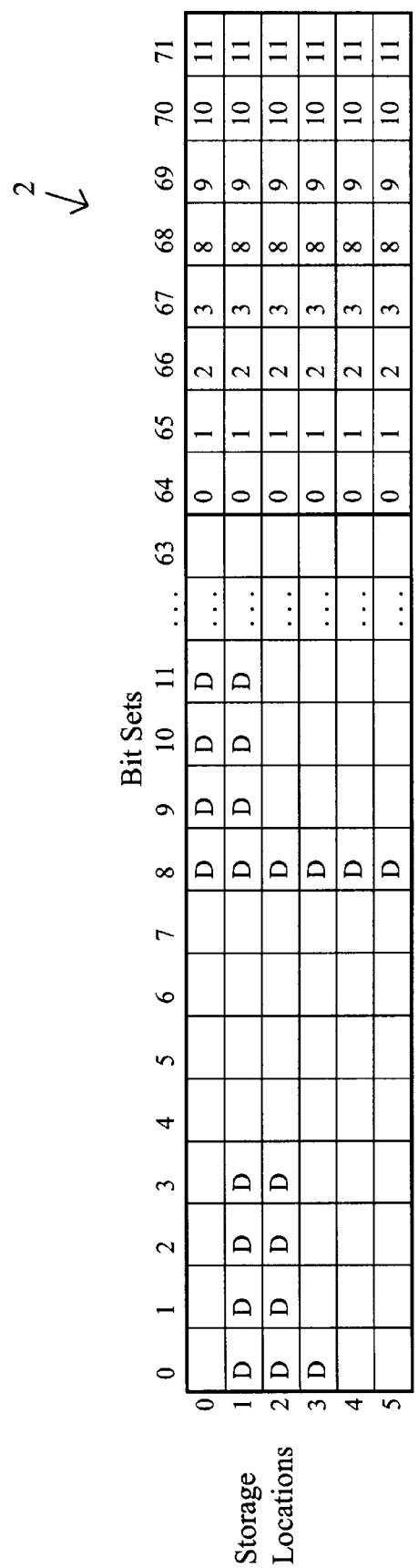
FIG. 1 is a diagram of a memory block having defective bit sets and replacement bit sets according to an embodiment of the present invention.

A first embodiment of the present invention is directed to a computer apparatus for enabling computer memory with defective bit sets to be employed with high accuracy. As used herein, a "bit set" refers to a set of memory cells that stores or is designed to store corresponding data bits of plural data words. For example, a memory block 2 with 72 bit sets (0–71) of memory cells for six storage locations (0–5) is shown in FIG. 1. Each storage location includes 72 memory cells and corresponding memory cells in consecutive storage locations comprise a bit set. Although the bit sets of the memory block 2 are shown as columns of the memory block, each bit sets of a physical memory block is not necessarily in the same column of memory. For instance, the memory block 2 could be arranged as a single row of 432 (72×6) memory cells. The memory block 2 would still have 72 bit sets with the memory cells of each bit set occurring 72 memory cells from each other. Thus, bit set 0 would include memory cells 0, 72, 144, 216, 288, and 360 and bit set 71 would include memory cells 71, 143, 215, 287, and 431 of the memory row.

In the first embodiment, the apparatus detects defective bit sets of the first 64 bit sets (0–63) memory block 2 and maps the defective bit sets to non-defective replacement bit sets (64–71). A bit set is defective if one or more of the memory cells that comprise the bit set is defective. For example, in the memory block 2 of FIG. 1, bit set 0 includes three defective memory cells (denoted by "D") for storage locations 1, 2, and 3. As a result, bit set 0 is defective even though not all of the memory cells for bit set 0 are defective. Similarly, bit sets 1, 2, 3, 8, 9, 10, and 11 are also defective. Given that storage locations 0–3 have plural defective memory cells, prior art error collection codes cannot be employed to enable storage locations 0–3 to store 64-bit data words accurately. Instead, the method of the first embodiment maps bit sets 0–3 and 8–11 to replacement bit sets 64–71, respectively. To store 64-bit data words in storage locations 0–5, the method stores bits 0–3 and 8–11 of each of the data words in respective replacement bit sets 64–71 rather than, or in addition to, defective bit sets 0–3 and 8–11.

As used herein, the term "memory block" refers broadly to either a single storage location or a group of plural storage locations. In one embodiment, each memory block is the size of a 4K page, although numerous other sized memory blocks can be employed.

Figure 2:
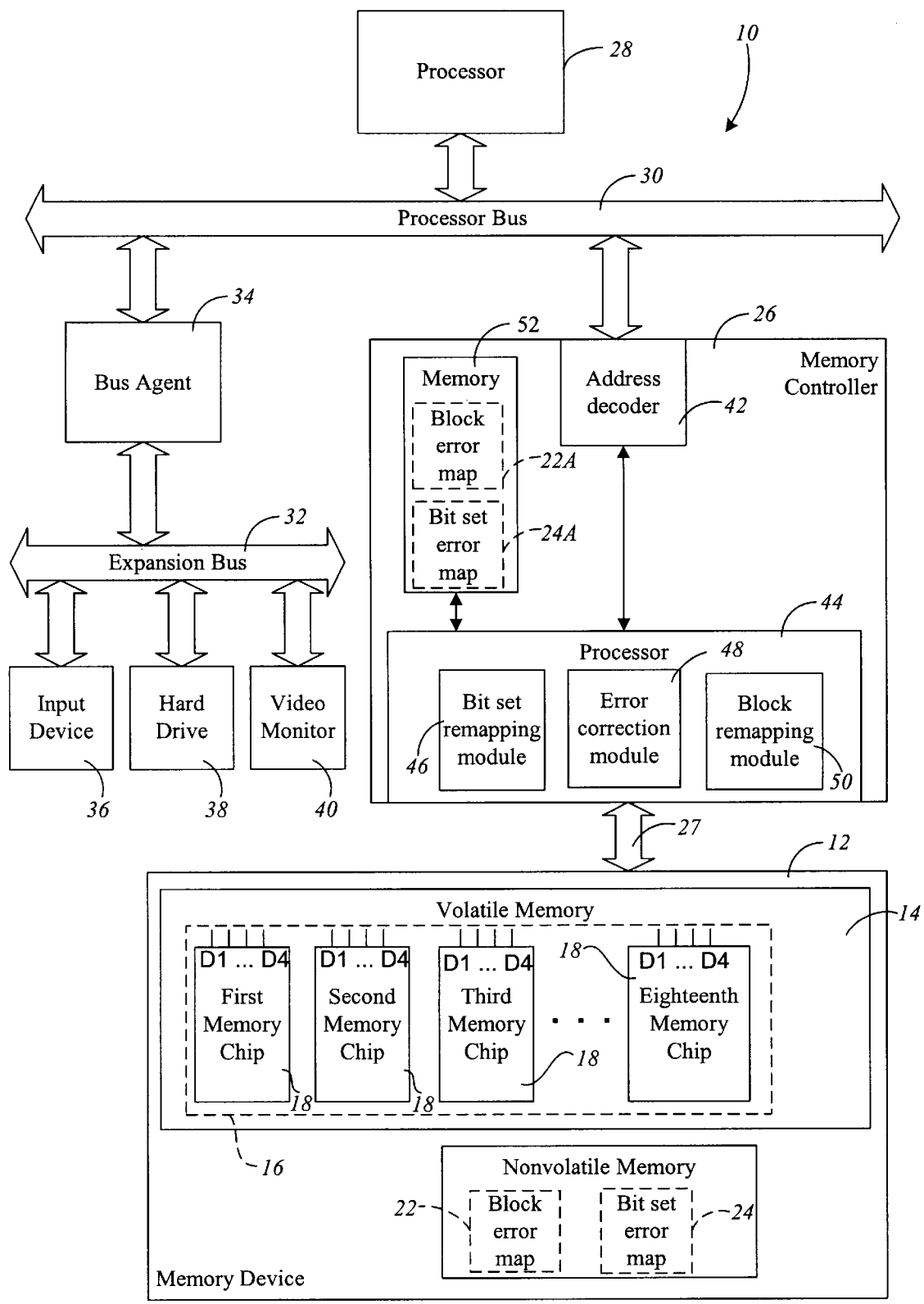
FIG. 2 is a block diagram of a computer system for remapping defective bit sets of a memory module memory block according to an embodiment of the present invention.

A computer system 10 for servicing memory access requests directed to a memory module 12 is shown in FIG. 2. The memory module 12 can be any of numerous types of memory modules, such as a double in-line memory module (DIMM). The memory module 12 includes a volatile memory section 14 that includes numerous addressable storage locations with each storage location including a number of volatile memory cells. The number of memory cells per storage location may vary according to the implementation of the computer system 10 and may be sufficient to store a data word of predetermined size, such as 8, 16, 32, or 64 bits. As used herein, each data word can include data or one or more software instructions.

In the embodiment shown in FIG. 2, the volatile memory section 14 includes a memory bank 16 of eighteen memory chips 18. The memory chips 18 may be implemented using dynamic random access memory (DRAM), but the invention is equally applicable for other types of volatile memory, such as static random access memory (SRAM). It will be appreciated that the volatile memory section 14 can include additional memory banks and each memory bank, including the memory bank 16, could include greater or less than 18 memory chips without departing from the invention.

In contrast to prior art memory modules, the memory module 12 includes a nonvolatile memory section 20 that stores a block error map 22 and a bit set error map 24. The error maps 22, 24 include indications of defective memory cells in memory portions of the volatile memory section 14, as discussed in more detail below. The nonvolatile memory section 20 can be composed of any type of semiconductor nonvolatile memory, such as erasable programmable read only memory (EPROM) and electrically erasable programmable read only memory (EEPROM).

The computer system 10 includes a memory controller 26 that controls the manner in which data is written to and read from the memory module 12. The memory controller 26 is coupled to the memory module 12 via a memory bus 27. The memory controller 26 interfaces the memory module 12 with a computer processor 28 via a processor bus 30. As is typical, the computer system 10 also includes an expansion bus 32 that is coupled to the processor bus 30 by a bus agent 34. Coupled to the expansion bus 32 are an input device 36, such as a keyboard, mouse, or electronic pen/tablet, a hard drive 38, and a video monitor 40.

The memory controller 26 includes an address decoder 42 and a processor 44 that enable the memory controller 26 to respond to requests for access to the memory module 12 from the processor 28 or bus agent 34 via the processor bus 30. The processor 44 may be a general purpose microprocessor program with software to perform memory control functions, but could also be of a hard-wired circuit design. The processor 44 includes a bit set remapping module 46, error correction module 48, and block remapping module 50, as discussed in more detail below. The memory controller 26 also includes a memory 52, which typically will be a nonvolatile memory module such as DRAM or SRAM.

In one embodiment, the memory bank 16 is known as a "X4 (pronounced 'by-4') device" because each of the memory chips 18 includes 4 data ports D1–D4 that allow foul data bits to be written to or read from the memory chip simultaneously. The four data ports D1–D4 of each of the memory chips 18 are coupled to data lines (not shown) of the memory bus 27 to receive data into the memory chips 18 from the memory controller 26. Each memory chip 16 also includes control ports (not shown) that are coupled to control lines (not shown) of the memory bus 27 to receive control signals, such as read, write, row address strobe (RAS#), and column address strobe(CAS#), from the memory controller 26. Each memory chip 18 also includes several address ports (not shown) coupled to address lines (not shown) of the memory bus 27 to receive the address of each storage location in the memory chips 18 desired to be accessed.

The memory chips 18 are connected in parallel to the control and address lines of the memory bus 27 so that the same control signals and address are provided to each of the memory chips 16. Each address received from the address lines indexes four consecutive memory cells in each of the memory chips, 18 such that four data bits can be written to or read from each of the memory chips 18 via the data ports D1–D4 in parallel. As such, a 64 bit data word can be stored in a single storage location with four memory cells in each of sixteen of the memory chips 18. The remaining two memory chips 18 are used to store data according to one or more error handling schemes, as explained below.

The volatile memory section 14 may include one or more defective memory cells in addition to numerous non-defective memory cells. As discussed above, one can employ an error correction scheme to compensate for a defective memory cell of a storage location. Such an error correction scheme adds to each data word plural error correction bits that enable the data word to be reconstituted in the event of an erroneous data bit within the data word.

For a 64-bit data word stored in the first through sixteenth memory chips 18, the error correction scheme would need to add eight error correction bits which may be stored in the seventeenth and eighteenth memory chips 18. As such, a 64-bit data word with eight error correction bits can be stored in a storage location having 72 memory cells in the eighteen memory chips 18 and can be addressed by a single memory address. However, as discussed above, such an error correction scheme typically is efficient only if a single bit of each data word is erroneous.

Rather than storing eight error correction bits for each 64-bit data word stored in the first through sixteenth memory chips 18, an embodiment of the present invention uses non-defective memory cells in the seventeenth and eighteenth memory chips 18 to store replacement data bits for any defective memory cells in the first through sixteenth memory chips for a given storage location. For example, if all four memory cells in the second memory chip 18 for a selected storage location are defective, data bits 4–7 of a data word to be stored in the selected storage location can be stored in the four memory cells in the seventeenth memory chip for the selected storage location rather than in the second memory chip. Given that there are eight memory cells in the seventeenth and eighteenth memory chips 18 for each storage location, up to eight defective memory cells in the first through sixteenth memory chips can be remapped to the eight memory cells in the seventeenth and eighteenth memory chips. It will be recognized that more or less than eight non-defective memory cells can be employed to enable defective memory cells for each storage location to be remapped to the non-defective memory cells.

In one embodiment of the present invention, defective memory cells are mapped to non-defective replacement memory cells on a storage location by storage location basis. For example, for a first storage location with defective memory cells 4–8 and 30–34, the memory cells 4–8 and 30–34 may be mapped to the eight non-defective replacement memory cells in the seventeenth and eighteenth memory chips for the first storage location. In a second storage location, defective memory cells 27–31 and 45–49 may be mapped to the non-defective replacement memory cells in the seventeenth and eighteenth memory chips for the second storage location. As such, each storage location may have memory cells from different bit sets mapped to non-defective replacement memory cells.

In an alternate embodiment, bit remapping is carried out for a memory block of plural storage locations in the volatile memory section 14 rather than for individual storage locations. In the alternate embodiment, defective bit sets in the first through sixteenth memory chips are mapped to non-defective replacement bit sets in the seventeenth and eighteenth memory chips. In the embodiment shown in FIG. 2, the first memory chip 18 includes bit sets 0–3 for storing data bits 0–3 of plural data words, the second memory chip includes bit sets 4–7 for storing data bits 4–7 of the data words, etc. If a selected memory block of the volatile memory section 14 has three storage locations including a first storage location with memory cells 5 and 6 being defective, a second storage location with memory cells 15 and 16 being defective, and a third storage location with memory cells 20 and 21 being defective, then bit sets 5, 6, 15, 16, 20 and 21 would all be remapped to non-defective replacement bit sets in the seventeenth and eighteenth memory chips 17–18. Thus, memory cells 15, 16, 20, and 21 of the first storage location would be remapped to memory cells in the seventeenth and eighteenth memory chips 18 even though memory cells 15, 16, 20, and 21 of the first storage location are not actually defective.

The bit set error map 24 stored in the non-volatile memory section 20 includes an indication of each defective bit set for each of plural memory blocks of the volatile memory section 14. The bit set error map 24 may be created in the factory that makes the volatile memory section 14 based on well-known tests that determine which memory cells of the volatile memory section 14 are defective. In one embodiment, every single memory cell is tested to determine whether it is defective, and if so, an error tag is created in the bit set error map 24 for the defective memory cell. Alternatively, if one memory cell of a bit set is determined to be defective, then an error tag is created for the entire bit set without testing all the memory cells of the bit set.

In the embodiment shown in FIG. 2, up to eight defective bit sets can be remapped to non-defective bit sets for each memory block. If more than eight bit sets of the memory block are defective, then the entire memory block is remapped to a non-defective replacement memory block. The block error map 22 includes an error tag for each memory block that includes more than eight defective bit sets. It will be appreciated that some threshold number other than eight can be employed to determine when bit remapping will be employed for a memory block and when block remapping will be employed. Furthermore, bit set remapping could be employed for all or part of the memory blocks of volatile memory section 14 regardless of how many bit sets are defective. In addition, it may be desirable to limit the size of the memory blocks to limit the number of defective bit sets in each memory block.

The error maps 22, 24 include an error tag for each of the defective memory blocks of the volatile memory section 14. The memory blocks are analyzed sequentially to determine which bit sets of each memory block are defective. If the memory block does not have more than a first threshold (e.g., one) of defective bit sets, then the memory block is marked as being non-defective. If the memory block has more than a second threshold (e.g., eight) of defective bit sets, then an error tag is created in the block error map 22 indicating that the memory block is sufficiently defective that it should be remapped to a non-defective replacement memory block. If the memory block has more than the first threshold of defective bit sets and not more than the second threshold of defective bit sets, then an error tag is added to the bit set error map 24 indicating that the defective bit sets of the memory block should be remapped to non-defective replacement bit sets. In addition, the bit set error map 24 is updated with error tags indicating which of the bit sets of the memory block are defective.

In one embodiment, the error maps 22, 24 are created by associating an error tag with each defective memory block and a non-error tag for each non-defective memory block. For example, the error tag may be a tag bit of a first logic value, such as 0, if the memory block is defective and the non-error tag may be a tag bit of a second logic value, such as 1, if the memory block is not defective. Alternatively, the error maps 22, 24 can simply include the addresses of the defective memory blocks such that the addresses not listed are assumed to be non-defective. In addition, the error maps 22, 24 can be implemented using a single error map rather than separate error maps. In that case, a second error tag can be employed to distinguish between memory blocks for which block remapping is being employed and memory blocks for which bit set remapping is being employed.

As discussed above, the bit set error map 24 also includes indications of which bit sets of each memory block are defective. Preferably the defective bit sets are listed in the bit set error map 24 in a predefined sequential order that corresponds to the order in which the defective bit sets are remapped to the non-defective replacement bit sets. For example, if bit sets 12–16 and 24–28 are defective, then the defective bit sets are listed in the bit set error table 24 in numerical order such that bit sets 12–16 are mapped to replacement bit sets 64–67 in the seventeenth memory chip 18 and defective lanes 24–28 are mapped to replacement bit sets 68–71 in the eighteenth memory chip 18. As such, the remapping is performed implicitly by the bit set remapping module 46 of the memory controller processor 44 without requiring each defective bit set to be explicitly mapped to a replacement bit set. Alternatively, the bit set remapping module 46 could create a bit set remapping table that stores, for each defective bit set, a code that represents the replacement bit set to which the defective bit set is being mapped.

In one embodiment, the error maps 22, 24 are created at the factory that makes the memory module 12 and stored in the nonvolatile memory section 20. After the error maps 22, 24 are created and stored in the nonvolatile memory section 20, the memory module 12 then can be incorporated into the computer system 10 by a computer manufacturer or a user desiring to upgrade the computer system 10. Alternatively, the error maps 22, 24 may be created and stored in the nonvolatile memory section 20 by the memory controller processor 44 after the memory module 12 is incorporated into the computer system 10. Creating the error maps 22, 24 after the memory module 12 has been incorporated in the computer system 10 enables the error maps 22, 24 to be updated to reflect newly defective memory blocks and bit sets that have become defective after the memory module 12 has been used as part of the computer system 10.

The memory controller processor 44 can determine that a bit set of a memory block has become defective by writing data to the memory block and then attempting to read the data from the memory block. If the data read from the memory block does not match the data written to the memory block, then the memory block is determined to be defective. The memory controller processor 44 then can modify either of the error maps 22, 24 as needed to reflect that the newly defective bit set is defective. If it is desired to enable the error maps 22, 24 to be so modified, the nonvolatile memory section 20 preferably is an EEPROM or other nonvolatile memory type that can be modified without removing the nonvolatile memory section 20 from the computer system 10.

When the computer system 10 is turned ON, the processor 44 in the memory controller 26 retrieves copies 22A, 24A of the block error map 22 and the bit line error map 24, respectively, from the nonvolatile memory section 20 of the memory module 12. The memory controller processor 44 stores the error maps 22A, 24A in the memory 46 of the memory controller 26. As discussed above, the memory 46 typically will be volatile memory but could be a nonvolatile memory module, such as an EEPROM, to enable the error maps 22A, 24A to be permanently stored in the memory controller 26. However, such nonvolatile memory modules usually are much slower than volatile memory modules.

In response to receiving the copy 22A of the block error map 22 from the nonvolatile memory section 20 of the memory module 12, the block remapping module 50 of the memory controller processor 44 creates a block remapping table. The block remapping table maps each of the defective memory blocks represented in the block error map 22 to a memory block of the volatile memory section 14 that is known to be non-defective. In other words, for each defective memory block represented in the block error map 22, the block remapping table includes an index that points to a non-defective replacement memory block of the volatile memory section 14. The block remapping module 50 may store the remapping table in a non-defective memory portion of the volatile memory section 14 or in the memory 46 of the memory controller 26.

Figure 3:
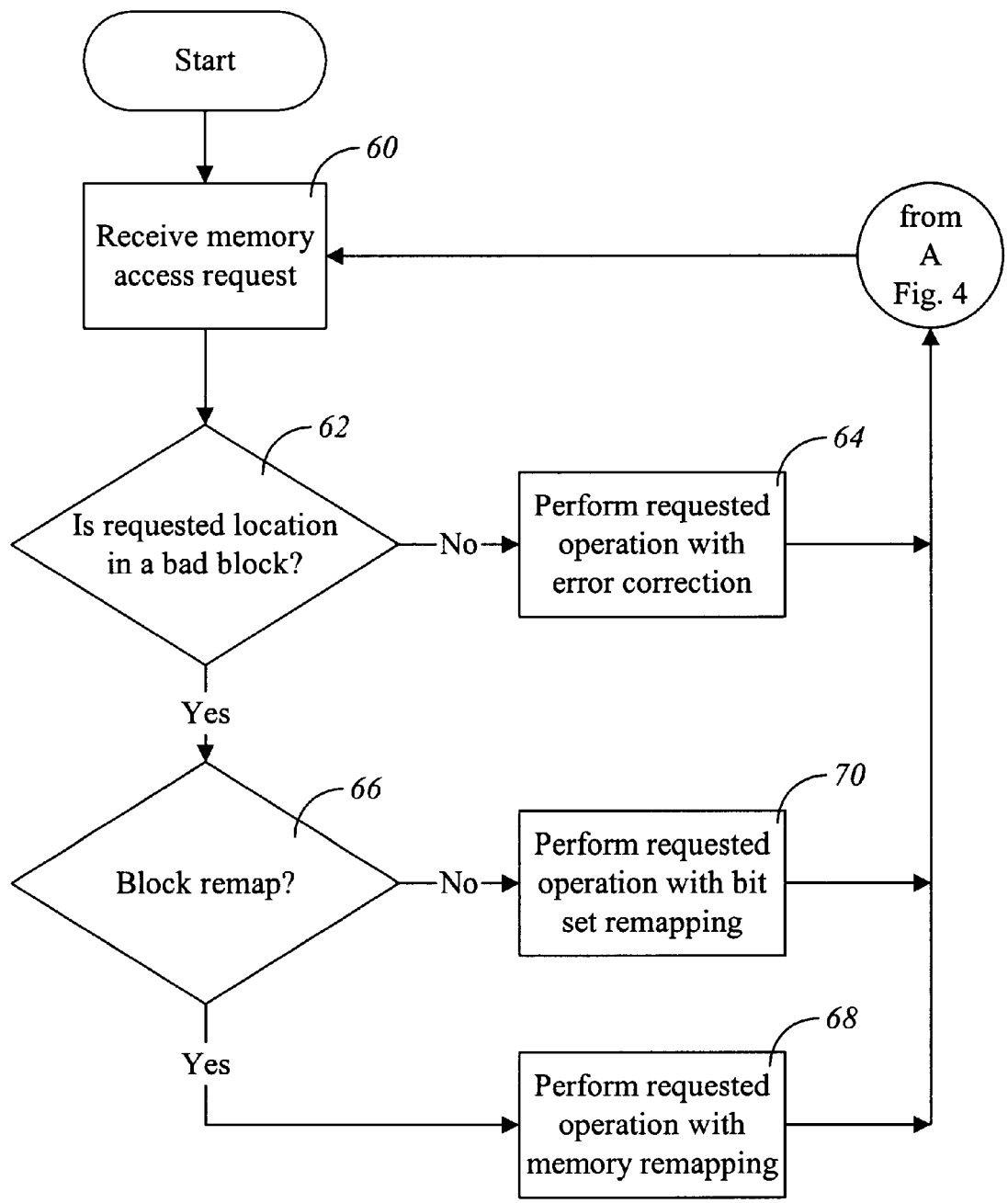
FIG. 3 is a flow diagram showing how a memory access request is processed according to an embodiment of the present invention.

After the error map copies 22A, 24A are stored in the memory 46 and the block remapping table is created and stored, the memory controller 26 is ready to receive and respond to requests for access to the memory blocks of the volatile memory section 14. A flow chart of the software executed by the memory controller processor 44 to process a memory access request according to an embodiment of the present invention is shown in FIG. 3. In step 60, a memory access request is received from a memory requester, such as the system processor 28. The memory access request can be a request to write data to or read data from a requested storage location of the volatile memory section 14. Typically, such a memory access request will include an indication of whether a read or a write is being requested together with an address of the requested storage location of the volatile memory section 14.

Step 62 determines whether the requested storage location is in a defective memory block of the volatile memory section 14. The memory controller processor 44 performs step 66 by determining whether the error maps 22A, 24A include an error tag for the memory block of the requested storage location. The entry in one of the error maps 22A, 24A for the requested storage location may be accessed using the same address used to identify the requested storage location in the volatile memory section 14 or other schemes for searching the error maps 22A, 24A may be employed. If step 62 determines that the memory block of the requested storage location is not defective, then in step 64 the requested operation (e.g., read or write operation) is performed using error correction. After performing, the requested operation, the memory controller processor 44 returns to step 60 to receive the next memory access request.

If the requested operation is a write operation, then the error correction module 48 computes error correction bits for the data word being written and writes the data word and error correction bits to the requested storage location. In the embodiment shown in FIG. 2, the data word is written into the 64 memory cells in the first sixteen memory chips 18 for the storage location and the error correction bits are written into the eight memory cells of the seventeenth and eighteenth memory chips 18 for the requested storage location. If the requested operation is a read operation, then a 64-bit data word and eight error correction bits are read from the 72 memory cells in the eighteen memory chips 18 for the requested storage location. The error correction module 48 determines from the error correction bits whether the data word read from the requested storage location includes any erroneous data bits. If not, then the data word is returned to the memory requester that requested access to the storage location. If the data word includes an erroneous data bit, then the error correction bits are used to correct the erroneous data bits before the data word is returned to the memory requester.

If it is determined in step 62 that the requested storage location is in a defective memory block, then in step 66 the memory controller processor 44 determines whether block remapping is appropriate for the memory block. The memory controller processor 44 can determine that block remapping should be employed if the block error map 22A includes an error tag for the memory block. If the error maps 22A, 24A are pair of a single error map, then a separate error tag will indicate whether block remapping or bit set remapping should be employed.

If step 66 determines that block remapping should be employed, then in step 68 the block remapping module 50 performs the requested operation using block remapping. The block remapping module 50 determines from the remapping table the non-defective replacement memory block to which the requested memory block was mapped. The block remapping module 50 performs the requested operation on the replacement memory block in a normal manner as if the replacement memory block was the memory block that was explicitly requested by the memory requester. After performing the requested operation, the memory controller processor 44 returns to step 60 to receive the next memory access request.

Figure 4:
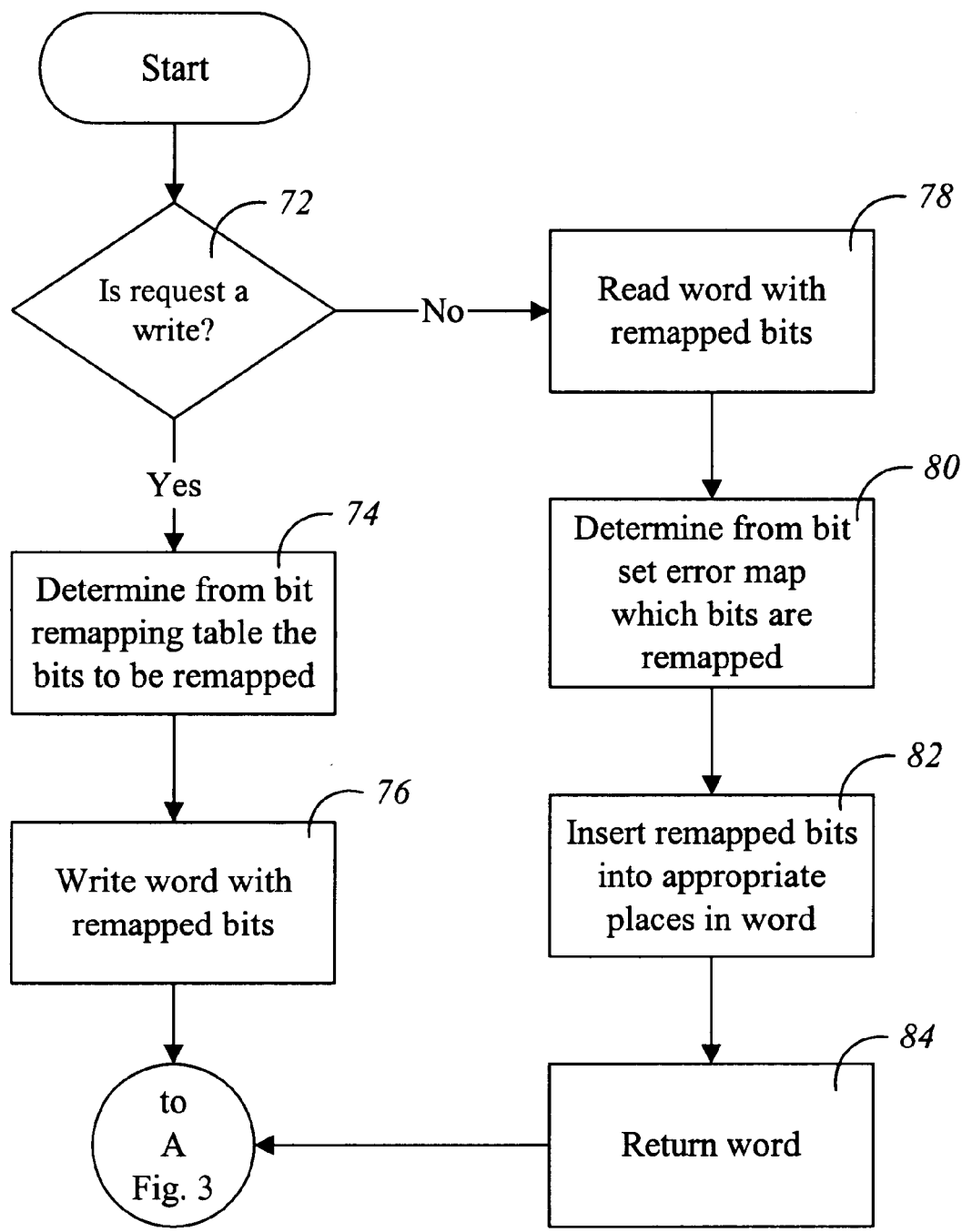
FIG. 4 is a flow diagram showing how a memory access request is processed using a bit set error map according to an embodiment of the present invention.

If the memory controller processor 44 determines in step 66 that bit set remapping is to be performed, then in step 70 the requested operation is performed using bit set remapping. A flowchart showing how the bit set remapping module 46 performs the requested operation using bit set remapping is shown in FIG. 4. In step 72, the bit set remapping module 46 determines whether the request for access to the requested storage location is a write request. If so, then in step 74 the bit set remapping module 46 determines from the bit set error map 24A which data bits of the data word being written should be remapped. For example, if the bit set error map 24A indicates that bit sets 8–15 of the memory block in which the requested storage location is located are defective, then data bits 8–15 of the data word are stored in memory cells 64–71 of the requested storage location rather than in memory cells 8–15. In the embodiment shown in FIG. 2, memory cells 64–71 are located in the seventeenth and eighteenth memory chips 18 and are accessed by the same address that is used to access the memory cells 0–63 of the requested storage location. In step 76, the bit set remapping module 46 writes the data word with the remapped data bits to memory cells 0–7 and 16–71 of the requested storage location. After writing the data word, the memory controller processor 44 indicates to the memory requester that the data word was written and returns to step 60 of FIG. 3 to receive the next memory access request.

If the bit set remapping module 46 determines in step 72 that the memory access request is not a write request, then in step 78 the bit set remapping module 46 reads the bits from the memory cells of the requested storage location. The data bits read from the requested storage location mail include data bits from memory cells of defective bit sets and data bits from target bit sets to which the defective bit sets have been mapped. In step 80 the bit set remapping module 46 determines from the bit set error map 24A which of the data bits read are from defective bit sets that were remapped to the replacement bit sets. In step 82 the bit set remapping module 46 replaces the data bits read from the defective bit sets with the data bits read from the target bit sets for the requested storage location. For example, if bit sets 4–11 are defective, then the bit set remapping module 46 replaces the data bits read from bit sets 4–11 with the replacement data bits read from bit sets 64–71 for the requested storage location. In step 84 the bit set remapping module 46 returns the data word read from the requested storage location to the memory requester that submitted the memory access request. After returning the data word, the memory controller processor 44 returns to step 60 (FIG. 3) to receive the next memory access request.

The entire process of creating and storing the error maps 22, 24 and responding to memory access requests using the error maps 22A, 24A is transparent to the system processor 28. As a result, there is no need for the software being run by the system processor 28 to be modified in any way to operate in conjunction with the memory module 12 or the memory controller 26 of the embodiments of the present invention.

Based on the foregoing discussion, it will be understood that the embodiments of the invention enable a memory module with defective memory cells to be employed in a computer system without fear of data being lost by attempting to store the data in the defective memory cells. In one aspect of the invention, one of plural error handling, schemes (error correction, block remapping, and bit set remapping) is employed in each memory block based on how many bit sets are defective in the memory block. Choosing which of plural error handling schemes to employ for each memory block based on the number of defective bit sets in the memory block enables defective memory chips to be employed without wasting valuable memory resources on sub-optimum error handling schemes. Moreover, unlike prior alt error corrections schemes that correct only single-bit errors, the present invention prevents multiple bit errors caused by defective bit sets.

It should be understood that even though numerous advantages of the present invention have been set forth in the foregoing description, the above disclosure is illustrative only. Changes may be made in detail and yet remain within the broad principles of the present invention.

I claim:

1. A computer memory device for storing data and instructions for use by a computer system having a memory controller for controlling the memory device, the memory device comprising:

a volatile memory section having a plurality of volatile memory blocks each containing a plurality of bit sets some of which may be defective; and a nonvolatile memory section having a bit error map that includes for each memory block a first code indicating that at least a first plurality of bit sets are defective and a second code indicating that a plurality of bit sets less than the first plurality are defective, the first code causing the memory controller to employ a first error handling scheme in which the defective bit set is mapped to a non-defective target bit set such that a request for access to the defective bit set will be processed by accessing the target bit set, the second code causing the memory controller to employ a second error handling scheme.

2. The computer memory device of claim 1 wherein each of the memory blocks comprise four kilobytes of memory locations.

3. The computer memory device of claim 1 wherein the non-volatile memory section includes a block error map that includes an indication of which of the memory blocks includes more than a predetermined number of defective bit sets so that the memory blocks can be remapped to non-defective memory blocks.

4. The computer memory device of claim 1 wherein the first plurality of defective bit sets comprise more than a predetermined number of bit sets.

5. The computer memory device of claim 4 wherein the second error handling scheme comprises generating and storing an error correction code for each stored data or instructions.

6. The computer memory device of claim 1 wherein the memory block includes 72 bit sets, and wherein the first plurality comprises between two and eight bit sets.

7. The computer memory of claim 1 wherein the bit error map further includes a third code indicating that a third plurality of defective bit sets are defective, the third code causing the memory controller to employ a third error handing scheme.

8. The computer memory of claim 7 wherein the second error handling scheme comprises generating and storing an error correction code for each stored data or instructions, and the third error handling scheme comprises remapping the block of memory corresponding to the third code.

9. The computer memory device of claim 1 wherein the second error handling scheme comprises generating and storing an error correction code for each stored data or instructions.

10. A computer memory device for storing data and instructions for use by a computer system having a memory controller for controlling the memory device, the memory device comprising:
 a volatile memory section having a plurality of volatile memory blocks each including a plurality of bit sets some of which may be defective; and
 a nonvolatile memory section having a bit error map that includes a first code for each memory block that includes no more than a first threshold number of defective bit sets, a second code for each memory block that includes greater than the first threshold number of defective bit sets, or a third code for each memory block that includes greater than a second threshold number of defective bit sets, the first code indicating that a first error handling scheme should be employed, the second code indicating that a second error handling scheme should be employed, and the third code indicating that a third error handling scheme should be employed.

11. The computer memory of claim 10 wherein the first error handling scheme comprises generating and storing an error correction code for each stored data or instructions, and the second and third error handling schemes each comprise remapping at least some of the bit sets in the block of memory containing the defective bit sets to non-defective bit sets.

12. A computer system for servicing a memory access request from a memory requester, comprising:
 a memory device having a plurality of memory blocks each including a plurality of bit sets some of which may be defective, each defective bit set including at least one defective memory cell; and
 a memory controller coupled to the memory device, the memory controller including:
  an error map having a first error tag that indicates which of the bit sets of the first memory block is defective as long as there are more than a predetermined number of defective bit sets in the first memory block, or a second error tag that indicates which of the bit sets of the first memory block is defective as long as there are not more than the predetermined number of defective bit sets in the first memory block; and
  a request processor that, in response to the memory access request, determines from the error map which of the bit sets of the first memory block is defective and, in response to detecting the first error tag in the error map, accesses a non-defective target bit set to which the defective bit set is mapped, and, in response to detecting the second error tag in the error map, accesses the memory device using an error correction code.

13. The computer system of claim 12 wherein the memory device comprises a nonvolatile memory section that stores error information that indicates which of the bit sets of the first memory block is defective, the memory controller retrieving the error information from the nonvolatile memory section to create the error map.

14. The computer system of claim 12 wherein each of the memory blocks comprise four kilo bytes of memory locations.

15. The computer system of claim 12 wherein the request processor includes a bit remapping module structured to map the defective bit set to the target bit set and access the target bit set in response to the request for access to the first memory block.

16. The computer system of claim 15 wherein the request processor further includes a block remapping module structured to determine whether a second one of the memory blocks includes lore than a predetermined number of defective bit sets and access a non-defective memory block in response to receiving a request for access to the second memory block if the block remapping module determines that the second memory block includes more than the predetermined number of defective bit sets.

17. The computer system of claim 12 wherein the error map lists the defective bit sets of the first memory block in a predefined order to enable the request processor to implicitly remap each defective bit set to a corresponding non-defective target bit set.

18. The computer system of claim 12 wherein the error map includes a bit set remapping table that explicitly remaps each defective bit set to a corresponding non-defective target bit set.

19. A computer system for servicing a memory access request from a memory requester, comprising:
 a memory device having a plurality of memory blocks including a defective first memory block having a defective bit set and a plurality of non-defective bit sets, the defective bit set including at least one defective memory cell; and
 a memory controller coupled to the memory device, the memory controller including:
  an error map having an error tag that indicates which of the bit sets of the first memory block is defective; and
  a request processor that, in response to the memory access request, determines from the error map which of the bit sets of the first memory block is defective and accesses a non-defective target bit set to which the defective bit set is mapped, the request processor further including all error correction module structured to determine whether a second one of the memory blocks includes less than a predetermined number of defective bit sets and stores error correcting codes in error bit sets associated with the second memory block such that an error in a bit of the second memory block can be corrected using the error correction codes.

20. A memory controller for servicing a memory access request directed to a memory device from a memory requester, the memory device having a plurality of memory blocks including a defective first memory block, the first memory block having a defective bit set with at least one defective memory cell, the memory controller comprising:
 an error map having an error tag that indicates which of the bit sets of the first memory block is defective, the error tag having a value indicating whether or not more than a predetermined number of bit sets of the first memory block is defective; and
 a request processor that, in response to the memory access request, determines from the error map which of the bit sets of the first memory block is defective and, based on the error tag value, either accesses a non-defective target bit set to which the defective bit set is mapped or accesses the bit set corresponding to the error tag using an error correction technique.

21. The memory controller of claim 20 wherein the request processor includes a bit remapping module structured to map the defective bit set to the target bit set and access the target bit set in response to the request for access to the first memory block.

22. The memory controller of claim 20 wherein the request processor further includes a block remapping module structured to determine whether a second one of the memory blocks includes more than a second predetermined number of defective bit sets and access a non-defective memory block in response to receiving a request for access to the second memory block if the block remapping module determines that the second memory block includes more than the second predetermined number of defective bit sets.

23. The memory controller of claim 20 wherein the request processor further includes an error correction module structured to determine whether the memory block includes not more than the predetermined number of defective bit sets and stores error correcting codes in error bit sets associated with the second memory block such that an error in a bit of the second memory block can be corrected using the error correction codes.

* * * * *

UNITED STATES PATENT AND TRADEMARK OFFICE
CERTIFICATE OF CORRECTION

PATENT NO. : 6,035,432  
DATED : March 7, 2000  
INVENTOR(S) : Joseph Jeddeloh

Page 1 of 1

It is certified that error appears in the above-identified patent and that said Letters Patent is hereby corrected as shown below:

<u>Column 12,</u>  
Line 5, change "kilo bytes" to -- kilobytes --  
Line 15, change "lore" to -- more --  
Line 46, change "all" to -- an --

Signed and Sealed this

Twenty-sixth Day of February, 2002

*Attest:*

*Attesting Officer*

JAMES E. ROGAN  
*Director of the United States Patent and Trademark Office*